United States Patent [19]

Horie

[11] 4,049,476
[45] Sept. 20, 1977

[54] METHOD OF MANUFACTURING A SEMICONDUCTOR INTEGRATED CIRCUIT DEVICE WHICH INCLUDES AT LEAST ONE V-GROOVE JFET AND ONE BIPOLAR TRANSISTOR

[75] Inventor: Noboru Horie, Kodaira, Japan

[73] Assignee: Hitachi, Ltd., Japan

[21] Appl. No.: 617,641

[22] Filed: Sept. 29, 1975

[30] Foreign Application Priority Data

Oct. 4, 1974  Japan ............................... 49-113854

[51] Int. Cl.² .................. H01L 21/22; H01L 21/306; H01L 29/76
[52] U.S. Cl. ..................................... 148/175; 29/571; 29/580; 148/1.5; 148/187; 156/647; 357/22; 357/43; 357/55
[58] Field of Search ....................... 148/1.5, 175, 187; 156/17; 29/571, 580; 357/22, 43, 55

[56] References Cited
U.S. PATENT DOCUMENTS

| 3,474,308 | 10/1969 | Kronlage | 357/43 X |
| 3,538,399 | 11/1970 | Bresee et al. | 357/22 X |
| 3,576,475 | 4/1971 | Kronlage | 148/175 X |
| 3,594,241 | 7/1971 | Bresee | 357/43 X |
| 3,796,612 | 3/1974 | Allison | 148/175 |
| 3,924,265 | 12/1975 | Rodgers | 357/23 |
| 3,930,300 | 1/1976 | Nicolay | 29/571 |

*Primary Examiner*—L. Dewayne Rutledge
*Assistant Examiner*—W. G. Saba
*Attorney, Agent, or Firm*—Craig & Antonelli

[57] ABSTRACT

A method of manufacturing a semiconductor integrated circuit device, which includes at least one junction field-effect transistor and at least one bipolar transistor, is characterized in that a groove portion is formed by chemically etching a part of a diffused layer for the channel region of the junction field-effect transistor, and that a layer for the gate of the junction field-effect transistor having a conductivity type to opposite to that of the channel region is formed by diffusion in the diffused layer of the channel region beneath the groove portion, whereby the pinch-off voltage $V_p$ of the junction field-effect transistor is made as small as possible and is also made smaller than the base-emitter reverse withstand voltage $V_{BEO}$ of the bipolar transistor.

4 Claims, 5 Drawing Figures

METHOD OF MANUFACTURING A SEMICONDUCTOR INTEGRATED CIRCUIT DEVICE WHICH INCLUDES AT LEAST ONE V-GROOVE JFET AND ONE BIPOLAR TRANSISTOR

FIELD OF THE INVENTION

This invention relates to a method of manufacturing a semiconductor integrated circuit device (IC).

DESCRIPTION OF THE PRIOR ART

In case of assembling a junction field-effect transistor into a bipolar monolithic IC without increasing the number of steps of the manufacturing process of the IC, it has heretofore been a practice that a P-type diffused layer for the channel region of the junction field-effect transistor and an N$^+$-type diffused layer for the gate thereof are formed at the same time as the formation of a P-type diffused layer for the base of an N-P-N transistor and an N$^+$-type diffused layer for the emitter thereof.

This method of manufacturing the IC, however, has involved the drawback that unless the base width of the N-P-N transistor is made small as shown in FIG. 1 so as to render the current gain $h_{FE}$ extraordinarily high, the pinch-off voltage $V_p$ of the junction field-effect transistor will not become lower than the base-emitter reverse withstand voltage $V_{BE}$. Accordingly, in case of assembling into the conventional bipolar IC the junction field-effect transistor whose pinch-off voltage $V_p$ is as small as possible, there has been the disadvantage that a method of manufacture which attains an extraordinarily high current gain $h_{FE}$ for the N-P-N transistors, being the main constituents of the IC, must be adopted.

SUMMARY OF THE INVENTION

It is therefore an object of this invention to provide a method of manufacture which forms a junction field-effect transistor of low pinch-off voltage $V_p$ within a bipolar IC by simple steps of manufacture.

The fundamental construction of this invention for accomplishing this object resides in a method of manufacturing a bipolar monolithic IC which includes at least one junction field-effect transistor, characterized in that a groove portion is formed by chemically etching a part of a diffused layer to become the channel region of the junction field-effect transistor and that a diffused layer for the gate of the junction field-effect transistor having a conductivity type opposite to that of the channel region is formed in the diffused layer of the channel region beneath the groove portion.

PREFERRED EMBODIMENT OF THE INVENTION

Figure 1:
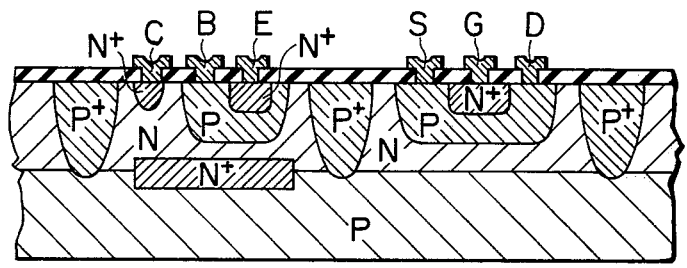
FIG. 1 is a schematic sectional view which shows a prior-art IC.
Figure 2A:
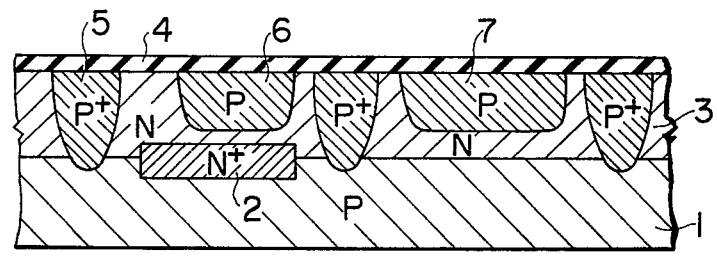
FIGS. 2a-2d are schematic sectional views which show an embodiment of this invention.

Referring to the FIGS. 2a-2a, numeral 1 designates a P-type silicon (Si) substrate, 2 an N$^+$-type buried layer, 3 an N-type epitaxial layer, 4 a silicon oxide (SiO$_2$) film, 5 a P$^+$-type isolating layer, 6 a P-type diffused layer for the base of an N-P-N transistor, 7 a P-type channel region for a junction field-effect transistor, 8 an N$^+$-type diffused layer for the emitter of the N-P-N transistor, 9 an N$^+$-type diffused layer for the gate of the junction field-effect transistor, and 10 an N$^+$-type diffused layer for leading out a collector electrode of the N-P-N transistor. Letters C, B and E indicate the collector electrode, a base electrode and an emitter electrode of the N-P-N transistor, respectively, while letters S, D and G denote a source electrode, a drain electrode and a gate electrode of the junction field-effect transistor, respectively.

The method of manufacturing an IC according to the invention will now be described with reference to FIGS. 2a-2d. First, as illustrated in FI. 2a, the N+-type buried layer 2 is formed at a selected area on the P-type Si substrate 1, whereupon the N-type epitaxial layer 3 is formed on them. After forming the SiO$_2$ film 4 on the N-type epitaxial layer 3, the P$^+$-type isolating layer 5 is formed by the mask diffusion which uses the film 4 as a mask. Subsequently, by the well-known diffusion technique employing the SiO$_2$ film 4 as a mask, the P-type diffused layer for the base 6 and the P-type channel region 7 are simultaneously formed in those regions of the N-type epitaxial layer 3 isolated by the P$^+$-type isolating layer 5 in which the N-P-N transistor is to be formed and in which the junction field-effect transistor is to be formed, respectively.

Figure 2B:
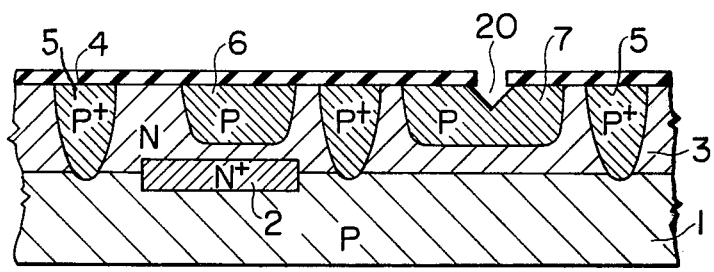

Next, as illustrated in FIG. 2b, a predetermined opening portion is formed in the SiO$_2$ film 4 on the P-type channel region 7 by well-known photoetching techniques. Subsequently, a part of the P-type channel region 7 is etched and removed with a chemical etchant and by employing the SiO$_2$ film 4 as a mask. Thus, a groove portion 20 is formed. In this case, when the P-type channel region 7 is etched by using as the etchant a mixed solution consisting of HF and HNO$_3$, a mixed solution consisting of HF, HNO$_3$ and CH$_3$COOH, or the like, the groove portion 20 is shaped into the letter V as seen in FIG. 2b because the region 7 is the {100} silicon crystal. The groove portion 20 can also be formed into a concave shape by etching region 7 for as long a time as may be needed.

Figure 2C:
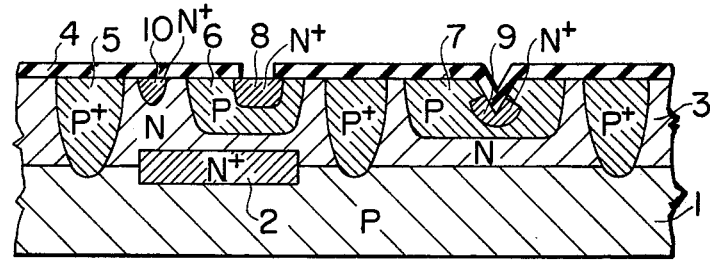

As illustrated in FIG. 2c, the N$^+$-type diffused layer 8 for the emitter of the N-P-N transistor, the N$^+$-type diffused layer 9 for the gate of the junction field-effect transistor and the N+-type diffused layer 10 for leading out the collector electrode of the N-P-N transistor are simultaneously formed by well-known selective diffusion.

In selectively diffusing an N$^+$-type impurity through the groove portion, the groove portion is processed as will now be stated. After forming the groove portion 20 as shown in FIG. 2b, an SiO$_2$ film (not shown) is formed on the entire surface of the groove portion 20. Subsequently, in order to expose only the bottom part in the groove portion 20, the SiO$_2$ film at the bottom part is removed by photoetching. Thus, a diffusion mask for the selective diffusion through the groove portion is formed. If a large gate stray capacitance is allowed for the junction field-effect transistor, the above processing for the groove portion 20 need not be especially made, and the mask 4 resultant from the formation of the groove portion 20 as illustrated in FIG. 2b may be used in that condition as the mask for the selective diffusion through the groove portion 20.

Figure 2D:
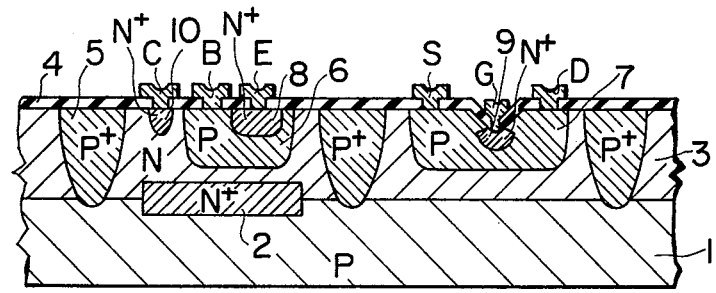

Lastly, as illustrated in FIG. 2d, the electrodes C, B, E, S, G and D of the respective elements are formed by the evaporation of aluminum (Al) and photoetching.

The junction field-effect transistor in the IC which is formed by such a method of manufacture and which includes the N-P-N transistors as its main constituents can have the pinch-off voltage $V_p$ made as small as possible and also made smaller than the base-emitter reverse withstand voltage $V_{BEO}$ of the N-P-N transistor. More specifically, the channel width becomes as small as possible for the reason that the groove portion is formed by etching and removing a part of the P-type channel region 7 in the shape of a V or a concave shape through the etching with chemicals and that the $N^+$-type diffused layer for the gate 9 is formed in the region corresponding to the groove portion. In addition, the reverse withstand voltage between the P-type channel region 7 and the $N^+$-type diffused gate layer 9 becomes higher than the reverse withstand voltage $V_{BEO}$ between the base and emitter of the N-P-N transistor for the reason that the $N^+$-type diffused layer for the gate 9 is formed at a deep part of the P-type channel region 7.

Further, the method of manufacture according to this invention as a smaller number of mask diffusion steps and photoetching steps as compared with the prior-art method of manufacturing the IC of this type, so that the manufacturing process is simplified and that the yield of manufacture is enhanced.

This invention is not restricted to the foregoing embodiment, but it is applicable to the manufacture of IC's in various aspects.

I claim:

1. A method of manufacturing a semiconductor integrated circuit device which includes at least one junction field-effect transistor and at least one bipolar transistor, comprising the steps of:
    a. preparing a semiconductor substrate, having one principal surface with a plurality of isolated regions of a first conductivity type, extending thereinto from the one principal surface;
    b. simultaneously diffusing an impurity of a second conductivity type, opposite said first conductivity type, from said one principal surface into one of said isolated regions and into another of said isolated regions in order to form a first semiconductor region for a base region of said bipolar transistor in the one isolated region and to form a second semiconductor region for a channel region of said junction field-effect transistor in the other isolated region, thereby forming said first and second semiconductor regions having the same depth;
    c. etching a selected part of said second semiconductor region in order to form a groove within said second semi-conductor region; and
    d. diffusing an impurity of said first conductivity type simultaneously from said one principal surface into a selected part of said first semiconductor region and into a selected part of said second semiconductor region including the groove portion in order to form a third semiconductor region for an emitter region of said bipolar transistor within said first semiconductor region and to form a fourth semiconductor region for a gate region of said junction field-effect transistor within said second semiconductor region, thereby forming said fourth semiconductor region for the gate region deeper than said third semiconductor region for the emitter region from said one principal surface of the semiconductor substrate.

2. The method of manufacturing a semiconductor integrated circuit device as defined in claim 1, wherein said one principal surface of said semiconductor substrate has a crystal orientation of silicon in the {100} face, and said groove portion is V-shaped in cross-section.

3. In a method of manufacturing a semiconductor integrated circuit device which includes at least one junction field-effect transistor and at least one bipolar transistor, and includes the steps of:
    a. providing a semiconductor substrate having first and second isolated regions of a first conductivity type which extend to a first principal surface of said substrate;
    b. simultaneously diffusing an impurity of a second conductivity type, opposite said first conductivity type, into selected surface portions of said first and second isolated regions, respectively, so as to form third and fourth semiconductor regions of said second conductivity type; and
    c. simultaneously diffusing an impurity of said first conductivity type into selected surface portions of said third and fourth semiconductor regions, respectively, to form fifth and sixth semiconductor regions of said first conductivity type;
    said first, third and fifth semiconductor regions being the collector, base, and emitter regions of a bipolar transistor, and the distance between said first and fifth regions defining the base width and the current gain $h_{FE}$ of said bipolar transistor;
    said fourth and sixth semiconductor regions being the respective gate and channel regions of a junction type field-effect transistor, and the distance between said sixth region and said second region controlling the pinch-off voltage $V_p$ of said junction field-effect transistor,
    the improvement comprising a method for reducing the pinch-off voltage $V_p$ to a value smaller than the base-emitter reverse breakdown voltage $V_{BE}$ of said bipolar transistor without reducing the base width and increasing the current gain $h_{FE}$ of said bipolar transistor comprising the step of
    i. forming a groove in a selected surface portion of said fourth semiconductor region; and
    ii. forming said sixth region in step (c) by diffusing an impurity of said first conductivity type in the surface portion of said fourth region at the bottom of said groove therein, so that said sixth region extends deeper into said fourth region from said first principal surface than said fifth region extends into said third region.

4. The improvement according to claim 3, wherein said first principal surface of said substrate has the crystal orientation of the {100} face of silicon, and said groove is V-shaped in cross-section.

* * * * *